(12) United States Patent
Riviere-Cazeaux et al.

(10) Patent No.: US 8,302,036 B2
(45) Date of Patent: Oct. 30, 2012

(54) METHOD AND APPARATUS FOR DESIGNING AN INTEGRATED CIRCUIT

(75) Inventors: Lionel Riviere-Cazeaux, Austin, TX (US); Ashish Rajput, Bangalore, IN (US)

(73) Assignees: Freescale Semiconductor, Inc., Austin, TX (US); ST Microelectronics (Crolles 2) SAS, Crolles (FR)

( * ) Notice: Subject to any disclaimer, the term of this patent is extended or adjusted under 35 U.S.C. 154(b) by 506 days.

(21) Appl. No.: 12/522,038

(22) PCT Filed: Jan. 5, 2007

(86) PCT No.: PCT/IB2007/000538
§ 371 (c)(1),
(2), (4) Date: Jul. 2, 2009

(87) PCT Pub. No.: WO2008/081227
PCT Pub. Date: Jul. 10, 2008

(65) Prior Publication Data
US 2010/0077364 A1    Mar. 25, 2010

(51) Int. Cl.
*G06F 17/50* (2006.01)
(52) U.S. Cl. ............... 716/55; 716/52; 716/56
(58) Field of Classification Search ............... 716/50–56
See application file for complete search history.

(56) References Cited

U.S. PATENT DOCUMENTS

| | | | | |
|---|---|---|---|---|
| 3,751,647 A | * | 8/1973 | Maeder et al. | 713/401 |
| 5,822,218 A | * | 10/1998 | Moosa et al. | 716/52 |
| 6,393,602 B1 | * | 5/2002 | Atchison et al. | 716/56 |
| 6,449,749 B1 | * | 9/2002 | Stine | 716/56 |
| 6,738,954 B1 | * | 5/2004 | Allen et al. | 716/56 |
| 7,174,521 B2 | * | 2/2007 | Stine et al. | 716/52 |
| 7,346,865 B2 | * | 3/2008 | Su et al. | 716/52 |
| 7,487,476 B2 | * | 2/2009 | Bickford et al. | 716/136 |
| 7,503,020 B2 | * | 3/2009 | Allen et al. | 716/135 |
| 2002/0164065 A1 | | 11/2002 | Cai et al. | |
| 2003/0126581 A1 | * | 7/2003 | Pang et al. | 716/19 |
| 2005/0251771 A1 | * | 11/2005 | Robles | 716/5 |
| 2006/0095877 A1 | * | 5/2006 | Su et al. | 716/5 |
| 2008/0072208 A1 | * | 3/2008 | Yamaguchi et al. | 716/21 |
| 2008/0148196 A1 | * | 6/2008 | Su et al. | 716/2 |
| 2009/0307644 A1 | * | 12/2009 | Su et al. | 716/5 |

FOREIGN PATENT DOCUMENTS

| | | |
|---|---|---|
| WO | 2006024324 A | 3/2006 |
| WO | 2006058560 A | 6/2006 |
| WO | 2006063268 A | 6/2006 |

OTHER PUBLICATIONS

Guardiani et al; "Proactive design for manufacturing (DFM) for nanometer SoC designs"; IEEE Custom Integrated Circuits Conference, 2004, pp. 309-316.

Ferguson; "Shifting methods: adopting a design for manufacture flow"; 5th Int'l Symposium on Quality Electronic Design, 2004, pp. 171-175.

* cited by examiner

*Primary Examiner* — Stacy Whitmore

(57) ABSTRACT

Method and apparatus for designing an integrated circuit, IC, layout by identifying one or more defects in a feature within the IC layout. Determining if an identified defect is improvable. Calculating an improvability metric of the IC layout based on the number of improvable defects and the total number of identified defects.

13 Claims, 5 Drawing Sheets

METHOD AND APPARATUS FOR DESIGNING AN INTEGRATED CIRCUIT

FIELD OF THE INVENTION

The present invention relates to a method and apparatus for designing an integrated circuit.

BACKGROUND OF THE INVENTION

When making an integrated circuit (which may also be referred to as an IC, chip or device), a design layout of the IC is made using, for example, CAD tools. A reticle or mask is then produced for the IC design layout and then photolithography is used to transfer features from the reticle or mask to a die (integrated circuit semiconductor wafer).

Typically, the designer will build an IC layout design by adding and arranging cells, comprising multiple features, to the IC layout design. Once the cells have been arranged paths or tracks that will form the electrical connections on the wafer are defined to link the cells together.

Several IC layouts may be arranged together so that a single wafer may be manufactured producing several ICs that may subsequently be separated as required. The ICs will be tested to ensure quality is maintained. The yield is the ratio of the total number of usable ICs produced per wafer to the potential maximum number of ICs per wafer. The yield may be reduced by failures occurring within individual ICs produced from a wafer. There are many reasons why a failure may occur. For instance, if a particular track in an IC layout design is defined to be too thin, i.e. outside of a particular tolerance, a certain percentage of the ICs may be produced with this track broken following variations that may occur within the manufacturing process.

One way to reduce the number of defective ICs on a wafer is to increase the spacing between critical features in the IC layout design. However, this may lead to larger ICs and fewer ICs per wafer, thus lowering the yield even though a greater proportion of ICs actually produced will be usable.

Therefore, there is required a method and apparatus to improve the yield produced when manufacturing ICs.

SUMMARY OF THE INVENTION

The present invention provides a method and apparatus for designing an integrated circuit as described in the accompanying claims.

BRIEF DESCRIPTION OF THE FIGURES

The present invention may be put into practice in a number of ways and an embodiment will now be described by way of example only and with reference to the accompanying drawings, in which.

It should be noted that the figures are illustrated for simplicity and are not necessarily drawn to scale.

DETAILED DESCRIPTION OF AN EMBODIMENT

An IC layout design may be analysed in order to identify features that potentially contain defects. This may be achieved by using a design rule checker, for instance. A design rule checker contains a set of design rules that specify feature attributes likely to cause defects. For instance, a particular design rule may state that no neighbouring features may have a separation less than 45 nm. When checking features against this rule any features violating the rule will be marked as a defective feature. The rule set may contain many rules with each feature being checked against each rule in the set.

Once a set of defective features has been identified each defect may be analysed to determine whether or not the severity of the defect may be reduced. This analysis may depend on the type of defect that has been found as certain defect types are usually fixable or improvable or it could depend on the specific defect and the structure of the feature itself. This does not necessarily require each defect to be fixed but may require a certain amount of analysis per defect in order to determine whether or not an improvement may be made to reduce the likelihood of the defect causing an IC failure.

Then, the number of defects that may be improved may be summed and compared with the total number of identified defects in the IC layout design. This allows an overall improvability index to be determined for the particular IC layout under investigation, which may be expressed as a percentage of identified defects that may be improved.

The improvability index allows an assessment to be made as to whether or not the IC layout design should be sent back to an earlier design stage for reworking. A high improvability index may indicate that repetitive errors have been made and that reworking is required. It may be a more economical use of resources to fix these repetitive errors at an earlier stage than to fix the individual defects at a later stage using design techniques such as optical proximity correction, for instance. The higher the improvability index the greater the effort, time and/or computing resources that will be required to fix the defects. Obviously, this assumes that the total number of defects is constant. An improvability index below about 10% may be satisfactory. However, this is a flexible requirement dependent on the type of IC design and other percentages may be used.

Figure 1:
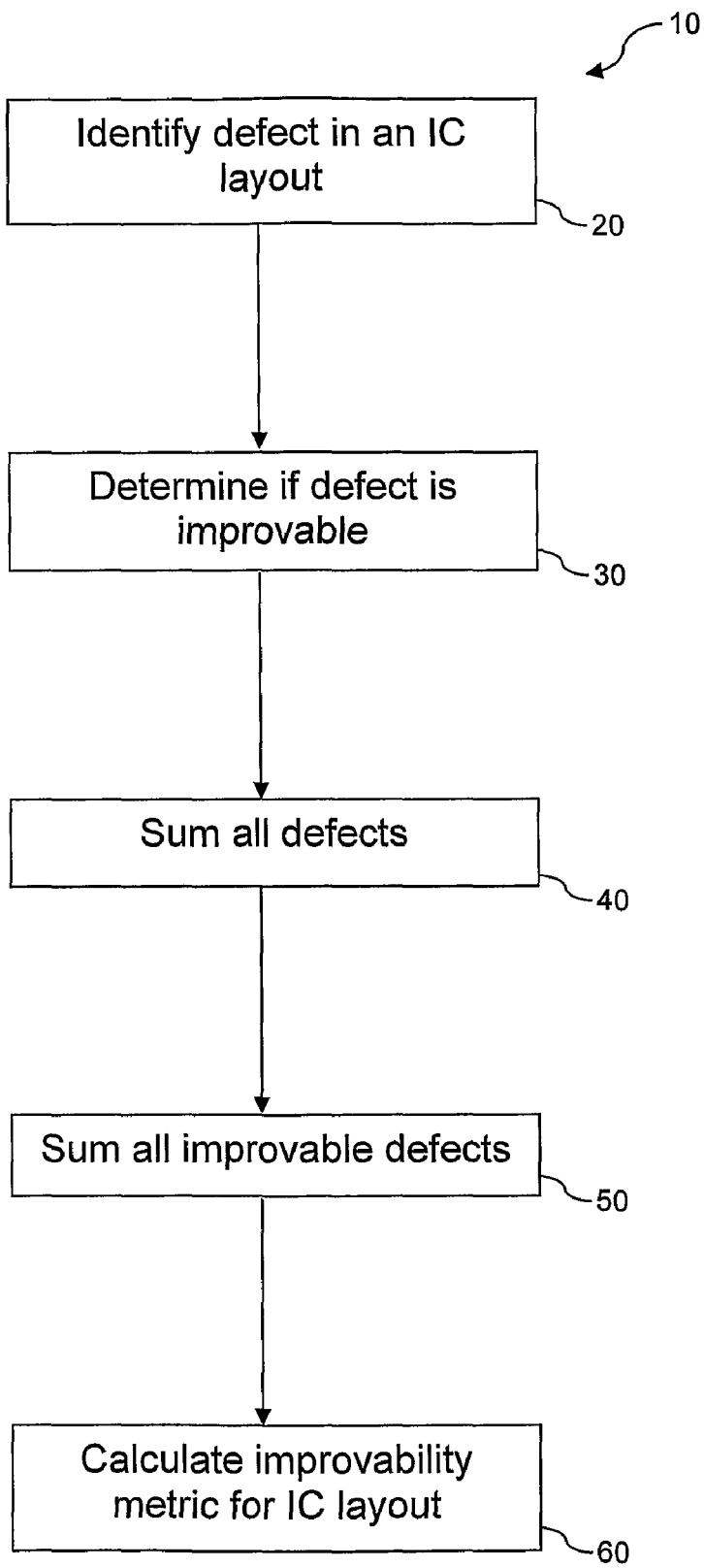
FIG. 1 shows a flow diagram of a method according to an embodiment of the present invention for calculating an improvability metric for defects in an IC layout, given by way of example.

FIG. 1 shows a flow diagram 10 of a method according to a preferred embodiment of the present invention. The method is performed once an IC layout design has been produced and is ready to be tested during one of the final design stages before a wafer is manufactured.

First, defects are identified in the IC layout design, step 20. This may be achieved by using a design rule checker such as Calibre nmDRC from Mentor Graphics, Wilsonville Oreg. 97070-7777 USA, running on suitable multi-CPU hardware and operating system such as EM64T Linux boxes.

Then, each defect may be analysed to determine whether or not it is improvable, step 30. SiFix from Sagantec, Fremont Calif. 94538, USA may be used to carry out this step although it is not necessary to completely fix any defect only to check if the defect is improvable to some extent. This step may be carried out immediately after the defect is identified or after all of the defects have been identified for the entire IC layout under consideration. Again, this software may be run on similar hardware, as previously described.

When a defect is identified its severity may be assessed. A scale of discrete categories may be used from minor to very severe, to categorise each defect. For instance, six categories may be used. In order to assess whether or not a defect is improvable, the defect category before it is investigated or an attempt to partially fix it is compared with its category after investigation or partial fix. If the category afterwards is lower (indicating the defect became less severe) the defect may be considered improvable. Each defect type may be pre-specified into separate categories according to severity. For instance, if a design rule is defined by a minimum separation between features, should two features be found to be in contact or within 10% of the minimum separation this may fall into the most severe category or defect. The next most severe category for this defect type may be specified as the separation between features being between 10% and 30% of the minimum separation.

After all of the defects have been identified they are summed, step 40 (or tallied as they are identified). After each defect has been categorised as improvable or not the improvable defects are also summed, step 50 (or tallied as each improvable defect is identified).

Finally, an improvability metric is calculated in step 60. This may be expressed as a percentage of improvable defects. The improvability metric may be calculated within a suitable computer system based on stored data generated during the previous steps.

Figure 2A:
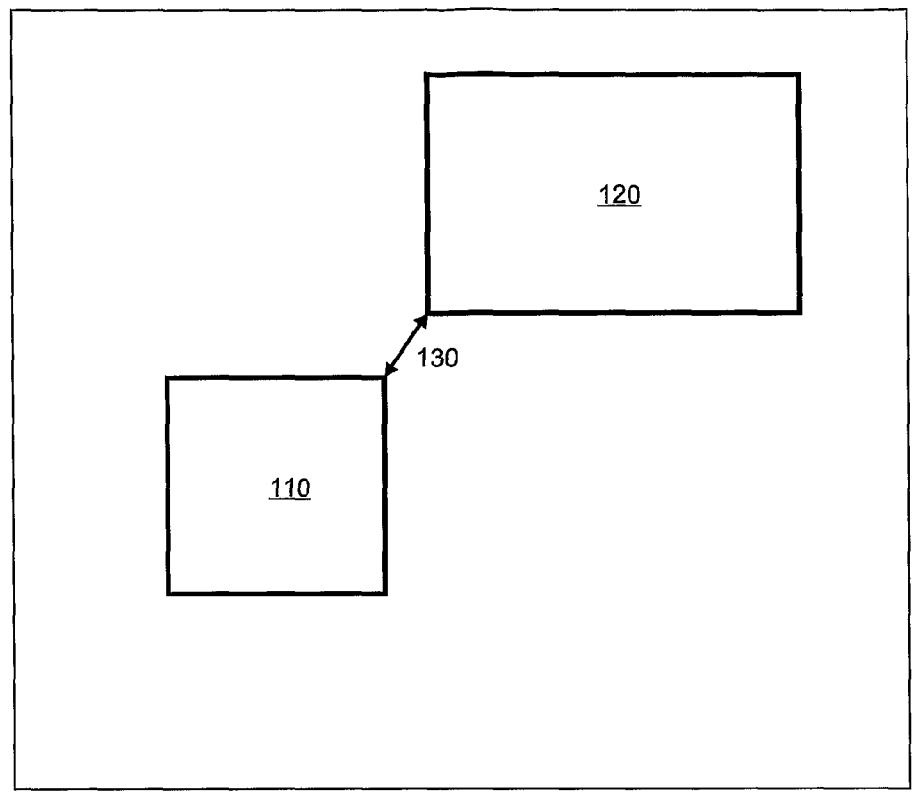
FIG. 2A shows a schematic diagram of a portion of an IC layout design containing a defect, given by way of example.
Figure 2B:
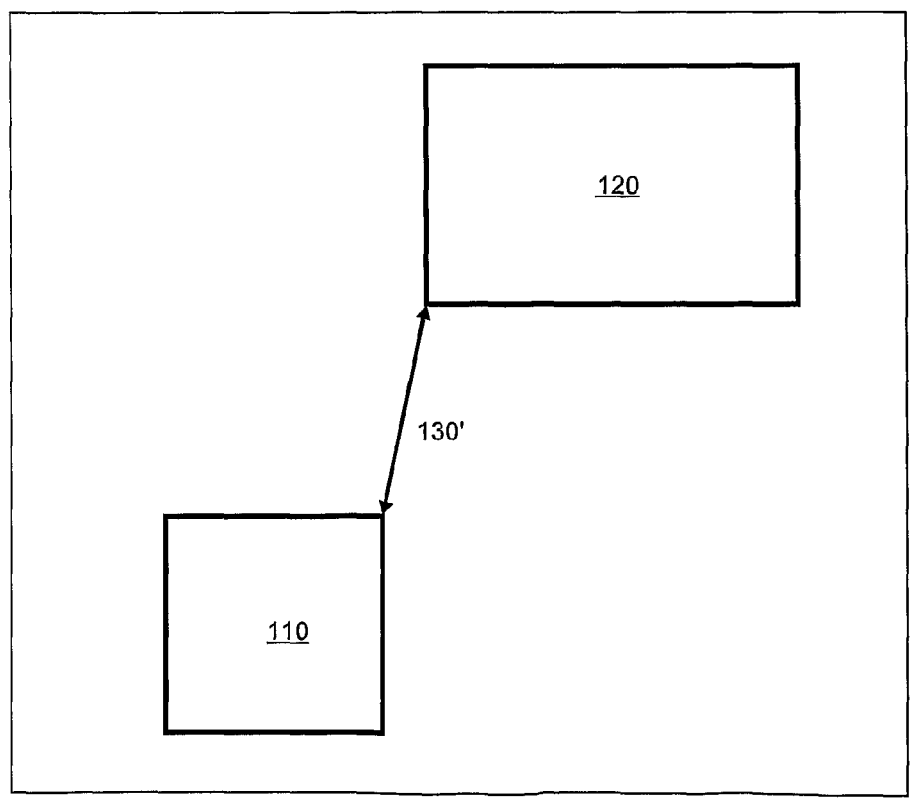
FIG. 2B shows a schematic diagram of the portion of the IC layout design shown in FIG. 2A with the defect improved.

FIGS. 2A and 2B shall be used to provide an example scenario of an improvable defect.

FIG. 2A shows a portion of a IC layout containing features 110 and 120. These two features are separated by a distance 130. Features 110 and 120 violate an example rule defining the minimum separation of features because separation 130 is less than this minimum separation.

FIG. 2B shows the same features 110 and 120 after the defect has been improved but not necessarily fixed.

Features 110 and 120 are separated by a distance 130' in this example, which is greater than the original separation 130. However, it is not necessarily greater than the minimum separation defined by the rule. It is not necessary that step 30 fixes the defect by actually defining the new positions of features 110 and 120 such that the rule is no longer broken. However, during step 30 it is determined that the defect may be improved, in this case by increasing the separation by an amount greater than that required to place the defect in a less severe category. The defect may be re-categorised after an attempt is made to improve it. If the new category is less severe than the original category, or if the defect may be completely fixed such that the design rule is no longer broken the defect is considered improvable.

Figure 3A:
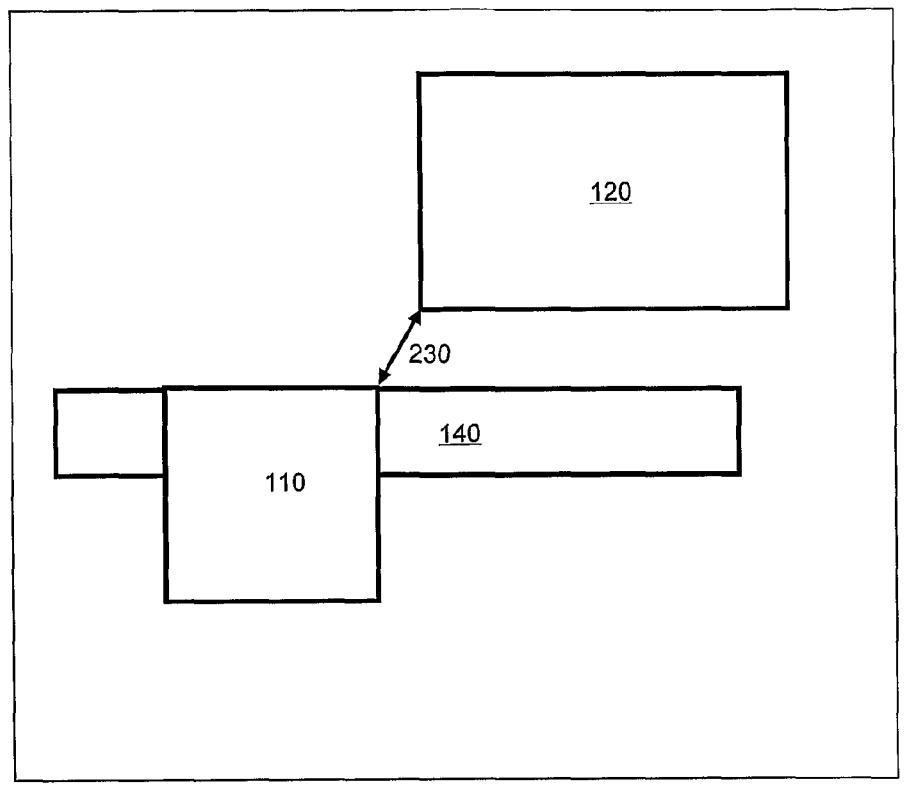
FIG. 3A shows a schematic diagram of a portion of an IC layout design containing a different defect to that of FIG. 2A.
Figure 3B:
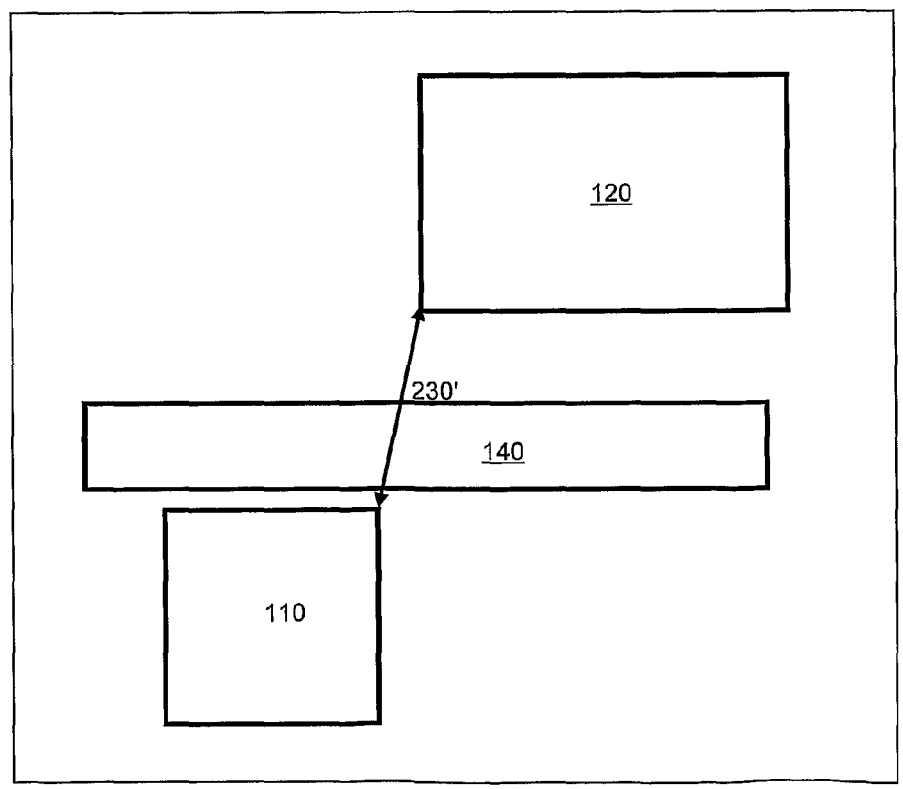
FIG. 3B shows a schematic diagram of the portion of the IC layout design shown in FIG. 3A following a failed attempt to improve the defect.

FIGS. 3A and 3B shall be used to provide and example scenario of a non-improvable defect. FIG. 3A shows similar features to FIG. 2A but includes an additional track 140, which forms a contact with feature 110.

Features 110 and 120 in FIG. 3A are separated by a distance 230, which again violates the minimum separation rule described with regards to FIGS. 2A and 2B. During step 30 an attempt is made to improve the defect by increasing the separation. FIG. 3B shows feature 110 in a new position such that the distance to feature 120 is now increased as shown by 230'. However, by increasing the separation, contact between feature 110 and track 140 is broken. Therefore, this defect cannot be improved and will not be included in the sum of step 50.

After determining if a defect is improvable it may be useful to record how many defects of a particular type are improvable in addition to summing the total number of improvable defects (step 50). This information may be useful to feed back to earlier design stages to improve future designs.

Figure 4:
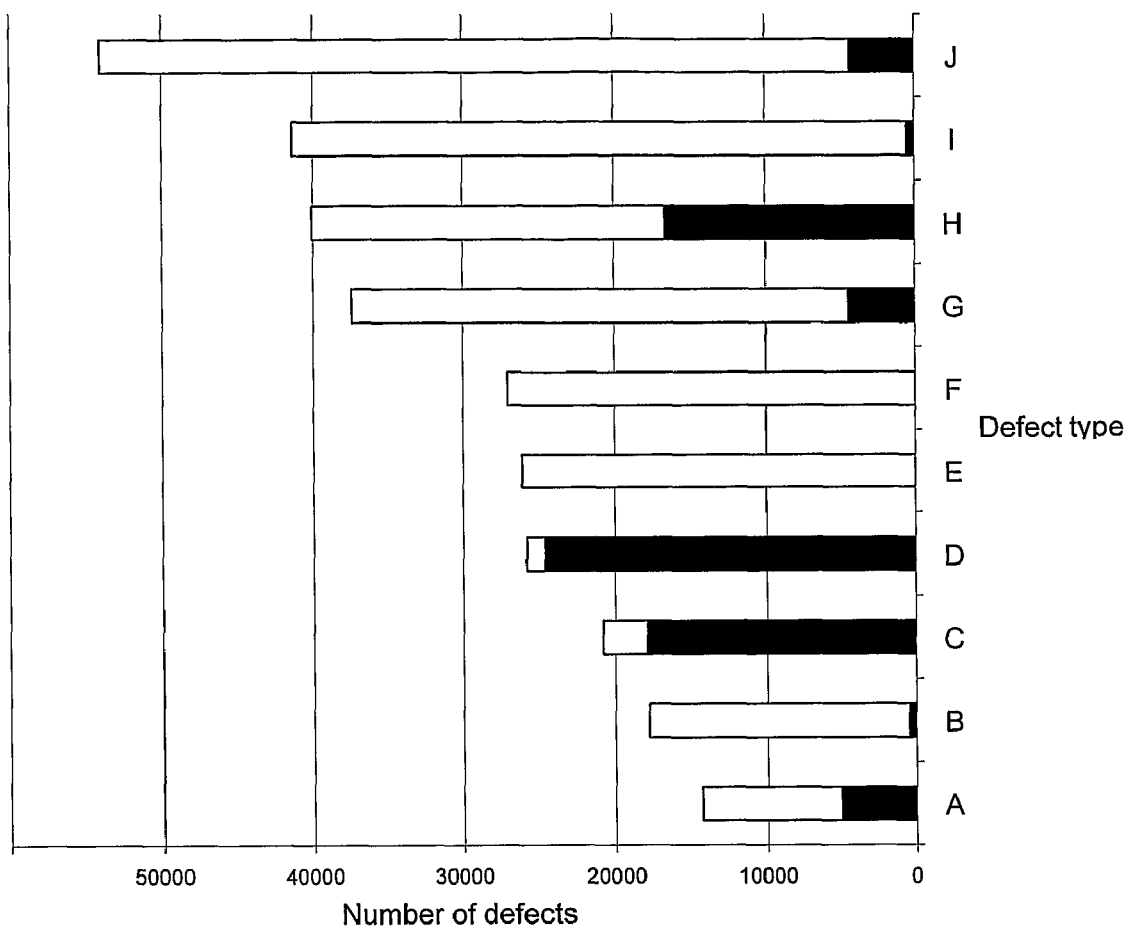
FIG. 4 shows a graph of defect types (y-axis) against total number of features containing a specific defect type (x-axis) for an example wafer.

FIG. 4 shows a graph of defect types (A-J on the y-axis) against total number of features containing a specific defect type (x-axis) for an example wafer. The column portions shown in white represent non-improvable defects. The column portions shown in black represent improvable defects. For instance, defect types E and F are completely non-improvable and so no further work may be required or beneficial on features exhibiting these defects. However, the majority of features exhibiting defect type D are improvable and so may require additional design rework.

It is important to note that identified defects do not always lead to IC failure but indicate that problems may arise and that these problems may lead to failure at a particular probability.

The method may be carried out on whole IC layouts, particular regions or cells that may form part of a cell library.

A library of cells may have each cell analysed according to the method 10 so that each cell has an associated improvability metric.

In an alternative embodiment of the present invention the improvability metric may include a weighting factor for each category of defects. This weighting factor may then be used to represent to greater significance of more severe defects and factor this in to the overall improvability metric. Equation 1 may then be used to calculate the improvability metric.

$$IX = W_1 I_1 + W_2 I_2 + \ldots W_n I_n \qquad \text{Equation 1}$$

where IX is the improvability metric, n is the number of defect categories, $W_n$ is the weighting factor for each defect category and $I_n$ is the number of improvable defects in category n.

A manufacturability metric is a measure of the quality of an IC layout. A definition of the manufacturability metric is the weighted sum of defects (weighting factor depends on the nature of each defect) whether improvable or not. The manufacturability metric is described by equation 2.

$$MX = W_1 D_1 + W_2 D_2 + \ldots W_n D_n \qquad \text{Equation 2}$$

where MX is the manufacturability metric, n is the number of defect categories, $W_n$ is the weighting factor for each defect category and $D_n$ is the number of defects in category n. The weighting factor $W_n$ may be the same or different to the weighting factors used to calculate IX.

MX may be normalised for wafer or IC layout area, A. The normalised MX, nMX may be represented by equation 3.

$$nMX = MX/A \qquad \text{Equation 3}$$

An alternative definition of the manufacturability metric is the weighted density of defect (weighting factor depends on the nature of each defect). It is possible to have very packed layouts with low improvability (little free room to improve) but with poor manufacturability metric (because most features are designed close the minimum of the technology). The manufacturability metric may be used in conjunction with the improvability index in order to obtain a fuller picture of the manufacturability of a layout.

A further indication of the quality of an IC layout design is the ratio of IX to MX (IX:MX).

Figure 5:
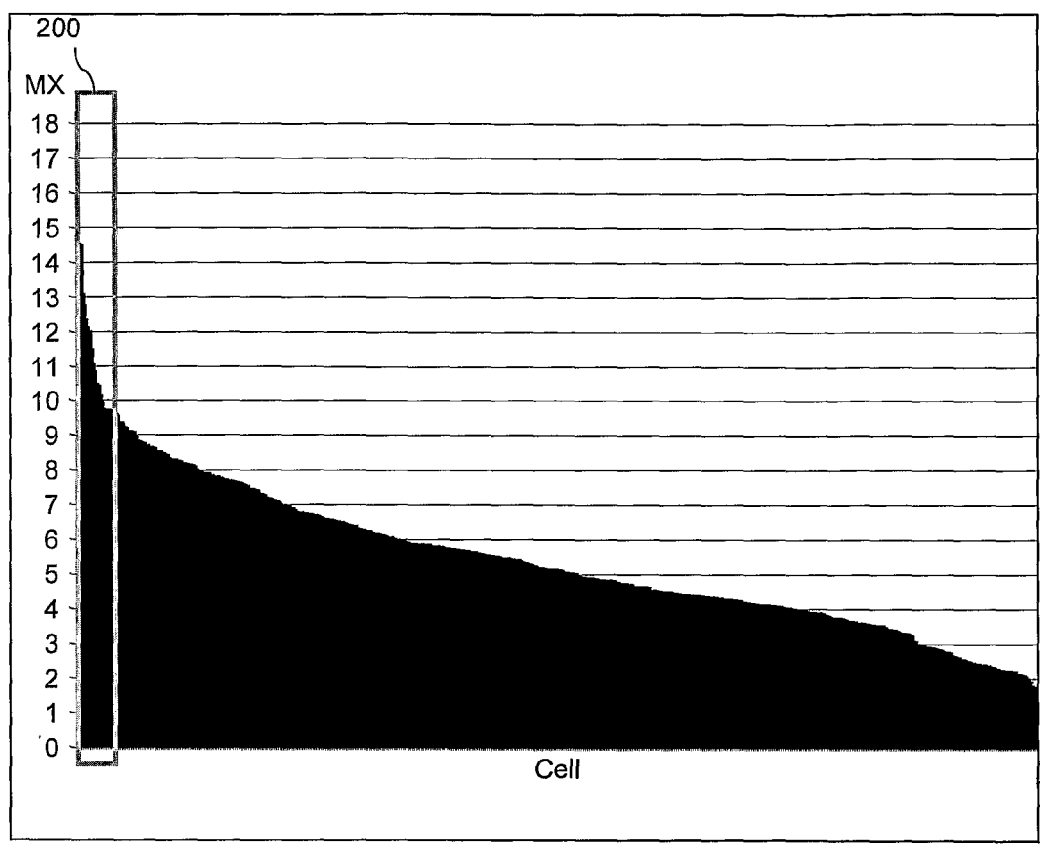
FIG. 5 shows a graph of a manufacturability metric found for cells.

FIG. 5 shows a graph of cells in a cell library, x-axis, against their manufacturability metric (weighted sum of defects MX), y-axis, for an example library of cells. Box 200 surrounds the area on the graph containing cells having the worst (or highest) manufacturability metric; in this case the top 3 percentile of cells although other percentiles may be used such as 1, 5 or 10, for instance. These 'outlier' cells may require additional re-design. This method provides a more effective way of identifying such cells at an earlier stage in the design process.

Alternatively, cells that have an improvability metric above a predetermined value, such as 10% for instance, or that fall within a particular percentile of cells with the highest improvability metric (for instance the top 10 percentile of cells), may also be flagged for further design work. In this way the overall quality of the cell library may be improved.

The method described above may be carried out in an automated manner using suitable apparatus or a computer programmed to perform each of the method steps.

As will be appreciated by the skilled person, details of the above embodiment may be varied without departing from the scope of the present invention, as defined by the appended claims.

For example, many defect types may be included, for instance around 70 different types may be investigated at once.

Several fixing strategies may be investigated for each defect rather than just a single one.

Large numbers of defects may be found, for instance up to 10 per μm of wafer.

The method may be carried out on individual cells making up cell libraries as well as complete IC layout designs.

Different types of investigations for different defect types may be used other that those previously described. For instance, certain defect types may usually be improved. Therefore, when these defects are identified minimal further investigation may be required as they may all be considered improvable.

The improvability metric may also be normalised for wafer or IC layout area.

The weighting factors used to generate improvability metrics and manufacturability metrics may be predetermined or varied based on the identified defects or other factors.

The improvability metric may also be described as a parameter or a value of the IC layout.

The manufacturability metric may also be described as a parameter or a value of the IC layout.

The invention claimed is:

1. A method of designing an integrated circuit, IC, layout comprising:
    identifying at a computer device one or more defects in a feature within the IC layout during a design stage of the IC layout;
    determining at the computer device if an identified defect is improvable by amending the feature with the identified defect and assessing if the defect has improved following amendment;
    calculating at the computer device an improvability metric of the IC layout based on the number of improvable defects and the total number of identified defects;
    comparing, at the computer device, the improvability metric with a predetermined threshold;
    reworking at the computer device the IC layout when the improvability metric exceeds the predetermined threshold; and
    normalising the improvability metric for wafer area.

2. The method according to claim 1, wherein the determining step further comprises considering the geometry of the feature.

3. The method according to claim 1, wherein the determining step further comprises applying a design rule criteria to the identified feature.

4. The method according to claim 1, wherein the determining step further comprises categorising each defect into discrete categories according to defect severity.

5. The method according to claim 4 wherein, the calculating step further includes the step of applying a weighting factor to the number of improvable defects for each category of defect.

6. The method according to claim 1, wherein the improvability metric, IX, is calculated by:

$$IX = W_1 I_1 + W_2 I_2 + \ldots W_n I_n$$

where n is a number of defect categories according to severity of defect, $W_n$ is a weighting factor for each defect category and $I_n$ is a number of improvable defects in category n.

7. A method of analysing a set of IC layouts comprising:
    Performing at a computer device the method according to claim 1 on each IC layouts in the set of IC layouts; and
    identifying the IC layouts that have the highest improvability metric, comprising identifying the IC layouts within the set of IC layouts that fall within the top 3 percentile of the IC layouts having the highest improvability metrics.

8. The method of claim 7 further comprising the step of reworking the identified IC layouts such that their improvability metric is reduced.

9. A computer programmed to perform the method of claim 1.

10. The method of claim 1, further comprising forming an integrated circuit based on the reworked IC layout.

11. A method of analysing an IC layout comprising:
    identifying at a computer device defects in the IC layout during a design stage of the IC layout;
    categorising at the computer device each identified defect according to severity of the defect;
    summing at the computer device weighted values based on the defects falling within each category to determine a weighted sum of the defects;
    calculating a manufacturability metric of the IC layout based on the weighted sum of the defects and
    normalising the manufacturability metric for wafer area.

12. The method according to claim 11, wherein the manufacturability metric, MX, is calculated by:

$$MX = W_1 D_2 + W_2 D_2 + \ldots W_n D_n$$

where n is a number of defect categories according to severity of defect, $W_n$ is a weighting factor for each defect category and $D_n$ is a number of defects in category n.

13. The method according to claim 11, wherein a normalised manufacturability metric, nMX, is calculated by:

$$nMX = MX/A$$

where MX is the manufacturability metric and A is the surface area of the IC layout.

* * * * *